(12) United States Patent
Suzumura et al.

(10) Patent No.: US 9,564,380 B2
(45) Date of Patent: Feb. 7, 2017

(54) MARKER PATTERN FOR ENHANCED FAILURE ANALYSIS RESOLUTION

(71) Applicant: SANDISK TECHNOLOGIES INC., Plano, TX (US)

(72) Inventors: Yoshihiro Suzumura, Yokkaichi (JP); Masato Takeo, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 103 days.

(21) Appl. No.: 14/469,248

(22) Filed: Aug. 26, 2014

(65) Prior Publication Data

US 2016/0064296 A1    Mar. 3, 2016

(51) Int. Cl.
*H01L 21/66* (2006.01)
*H01L 23/544* (2006.01)

(52) U.S. Cl.
CPC ............ *H01L 22/34* (2013.01); *H01L 23/544* (2013.01); *H01L 2223/5442* (2013.01); *H01L 2223/5446* (2013.01); *H01L 2223/54426* (2013.01); *H01L 2924/0002* (2013.01)

(58) Field of Classification Search
CPC .............................. H01L 22/34; H01L 23/544
See application file for complete search history.

(56) References Cited

U.S. PATENT DOCUMENTS

| 7,176,486 | B2 | 2/2007 | Nasuno et al. | |
|---|---|---|---|---|
| 2005/0110120 | A1* | 5/2005 | Wang | H01L 22/34 257/622 |
| 2007/0269994 | A1* | 11/2007 | Pratt | H01L 21/682 438/800 |
| 2015/0176979 | A1* | 6/2015 | Mathijssen | G03F 7/70633 355/77 |
| 2016/0019682 | A1* | 1/2016 | Takagi | H01L 22/12 382/149 |

FOREIGN PATENT DOCUMENTS

JP          H10-50787    *  2/1998    ............ H01L 21/66

* cited by examiner

*Primary Examiner* — David F. Dunphy
(74) *Attorney, Agent, or Firm* — Vierra Magen Marcus LLP (57) ABSTRACT

A marker pattern for enhancing resolution of a defect location along an axis in semiconductor defect analysis, and in particular, a marker pattern providing greater resolution in locating bit line defects using thermal laser stimulation methods such as OBIRCH. In an example, the marker pattern may consist of large markers, each having a set of associated small markers. Each of the small markers may be offset along an axis from each other. By identifying the small marker and its associated large marker which align with the defect, the bit line containing the defect may be more easily identified.

23 Claims, 10 Drawing Sheets

- first metal layer M0

Fig. 11

- first metal layer M0

- second metal layer M1

MARKER PATTERN FOR ENHANCED FAILURE ANALYSIS RESOLUTION

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

As semiconductor manufacturing processes become more miniaturized and complex, the causes for failure within semiconductor die are also becoming more complex. Depending on the nature of failure modes, various non-destructive methods may be used to locate defects, such as for example current time domain reflectometry (CTDR), infrared imaging technology, scanning acoustic microscopy (SAM), and x-ray computed tomography. More recently, thermal laser stimulation methods such as optical beam induced resistance change (OBIRCH) have been used in addition to or instead of some of the above methods. Failure analysis by OBIRCH involves scanning metal lines of an integrated circuit (IC) with a laser in the infrared region. The laser locally heats the metal lines. Areas of the metal lines containing a defect will heat differently than normal areas, resulting in resistance changes in those defect areas. By applying a constant voltage, areas having resistance changes will result in current changes, which can in turn be plotted in a brightness image, where areas of different current show up as "hot spots" of different pixel brightness. The brightness image can be overlaid onto the IC drawing so that areas on the IC which have defects show up as hot spots.

One problem is that the resolution of OBIRCH is around 5 µm, owing for example to the infrared wavelength of the laser. As the bit line pitch is on the order of 50 nanometers, conventional OBIRCH methods do not provide sufficient resolution with respect to the bit line defect location.

DETAILED DESCRIPTION

The present technology will now be described with reference to the figures which in embodiments relate to fault analysis of semiconductor circuits and more particularly, a marker pattern for providing greater resolution in locating bit line defects using thermal laser stimulation methods such as OBIRCH. In embodiments, the marker pattern is created in a metal layer formed on a semiconductor wafer near the TEG (test element group) circuit in the scribe line area of the wafer. The marker pattern may consist of large markers, each having a set of associated small markers. In embodiments, the small markers may be offset vertically (along the y-axis) from each other on the order of a micron. By visually identifying the small marker and its associated large marker which align along an axis with the TEG circuit defect shown in the OBIRCH image, the bit line containing the defect may be identified with greater precision than with conventional thermal laser stimulation methods alone.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "vertical" and "horizontal," "top" and "bottom" and "upper" and "lower" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figures 1, 2:
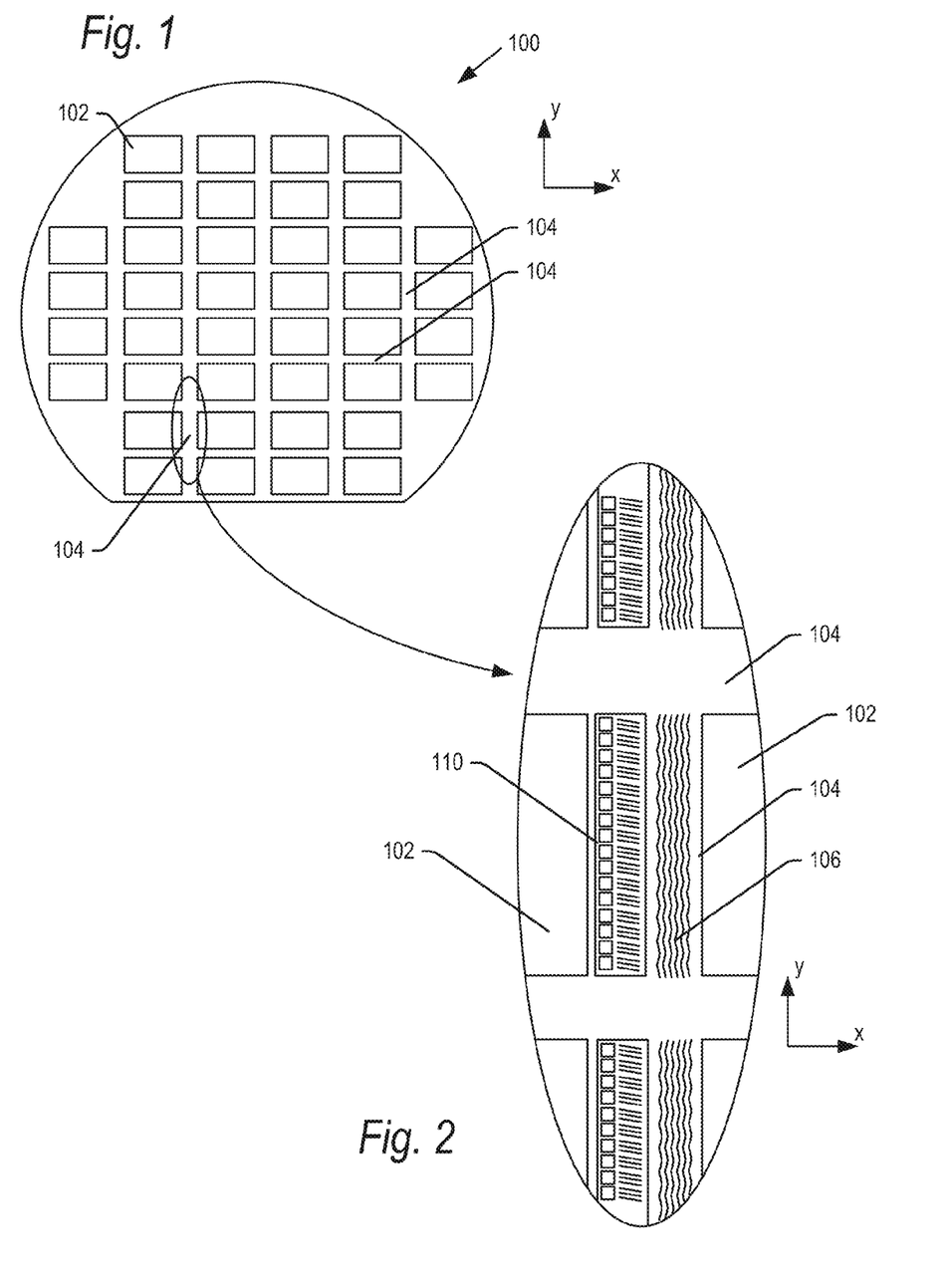
FIG. 1 is a top view if a semiconductor wafer according to embodiments of the present technology.
FIG. 2 is an enlarged top view of a portion of a scribe line area of the wafer of FIG. 1.

FIG. 1 illustrates a semiconductor wafer 100 including a plurality of semiconductor die 102 separated by scribe line areas 104 which extend along perpendicular x-y axes across the surface of the wafer 100 between the semiconductor die 102. (Only one semiconductor die 102 and a few scribe line areas 104 are numbered for clarity). The x and y axes are defined as being oriented parallel to the respective directions of the scribe line areas for convenience of description, and it is understood that scribe line areas may be oblique to the x and y axes in further embodiments. The wafer configuration shown is also by way of example and may vary in further embodiments. Similarly, the number and orientation of semiconductor die 102 is by way of example and the number, orientation and type of semiconductor die 102 may vary in different embodiments.

Once fabrication of the semiconductor die 102 on wafer 100 is completed, the wafer is diced by sawing through the scribe line areas 104. However, as is known, prior to dicing, TEG circuits may be formed in the scribe line areas 104 for testing and fault analysis. FIG. 2 is an enlarged section of wafer 100 illustrating scribe line areas 104 including a number of TEG circuits 106. TEG circuits 106 are shown oriented within the y-axis scribe line areas 104. In embodiments, each TEG circuit 106 may include integrated test circuits with word lines oriented horizontally (along the x-axis) and bit lines oriented vertically (along the y-axis). It is understood that the TEG circuits may alternatively be oriented in the horizontal x-axis scribe line areas 104, with the bit lines within the TEG circuits also oriented along the x-axis.

In accordance with aspects of the present technology, a marker pattern 110 may be formed alongside the TEG circuit 106. The marker pattern 110 may be provided in a metal layer formed in the scribe line area 104 as explained below. The TEG circuits 106 may be formed in the scribe line area 104 alongside one, some or all semiconductor die 102 on wafer 100. The marker pattern 110 may be formed in the scribe line area 104 alongside one, some or all of the TEG circuits 106. In one example, the marker pattern 110 may extend along the entire length of the TEG circuits 106 formed in each scribe line area 104.

The TEG circuits in scribe line areas 104 and the integrated circuits within semiconductor die 102 may be formed in known processes including for example a variety of masking and deposition steps, etching steps and doping steps. Once semiconductors are defined, they may be interconnected to form integrated circuits in the TEG and semiconductor die by the formation of a plurality of metal traces. As is known, a metal such as aluminum or copper may be deposited and patterned into conductive traces. Other metals may be used in further embodiments. Respective metal layers may be separated by dielectric insulating layers, formed for example of $SiO_2$, though other low dielectric constant materials may be used as the insulating layers.

Figure 3:
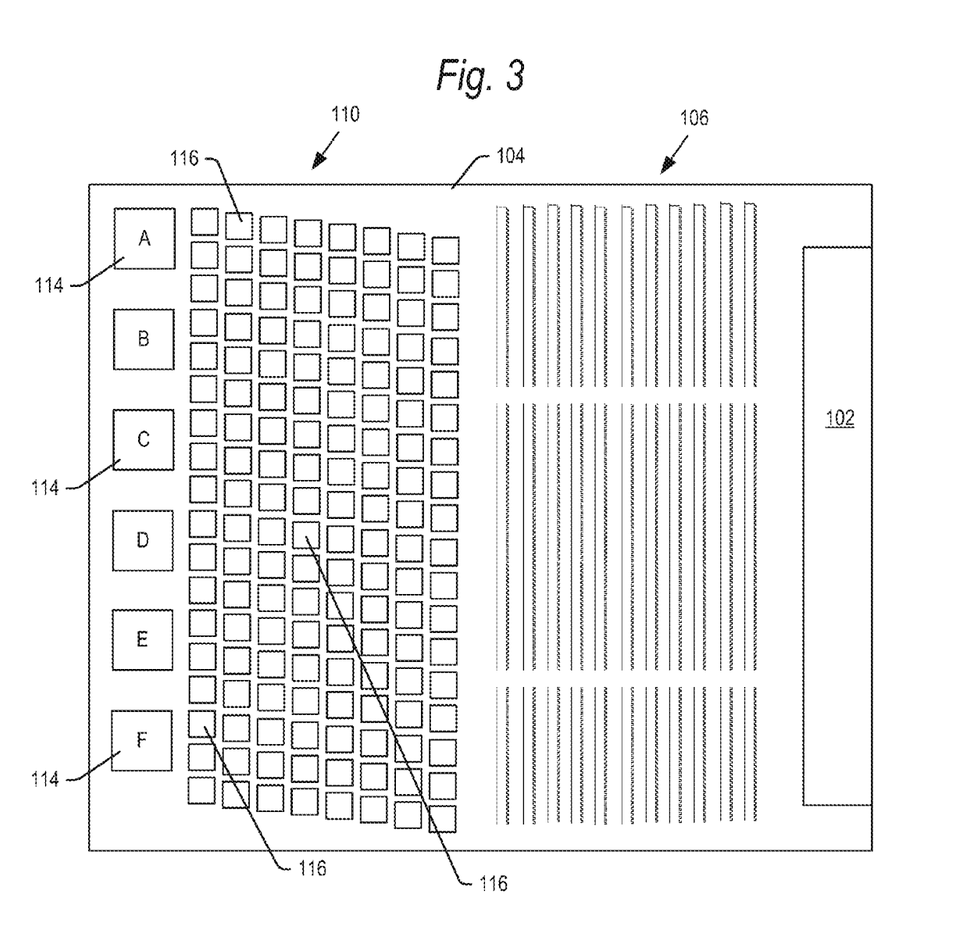
FIG. 3 is an enlarged top view of a section of the scribe line area of FIG. 2 showing a marker pattern according to embodiments of the present technology.

In embodiments, a blanket layer of metal may be applied, for example in the formation of the first metal layer. The blanket metal may then be etched and pattered into electrical traces for the TEG circuits 106 and semiconductor die 102 as is known. However, in addition to the formation of the metal traces for the TEG circuits and die, the metal layer may be etched to form the marker pattern 110. The marker pattern 110 may be defined in the first metal layer, to the side of and adjacent the TEG circuits 106 as shown in FIGS. 2 and 3. FIG. 3 shows a further enlargement of the wafer 100 showing a portion of a scribe line area 104.

The marker pattern 110 may be formed in metal layers other than the first layer, including the topmost (last) metal layer, in further embodiments. The marker pattern 110 may be formed in a single metal layer in embodiments, though different portions may be formed in multiple layers in further embodiments. In embodiments, the metal layer in which the marker pattern 110 is formed may also be used to form electrical traces in the TEG circuit 106. In further embodiments, the marker pattern 110 may be formed in a metal layer that is not also used to form electrical traces in the TEG circuit 106.

The marker pattern 110 may be spaced from the TEG circuits 106 by varying distances. In one example, the marker pattern 110 may be spaced between 5 μm and 10 μm from the TEG circuits 106, though this spacing may be more or less than that in further embodiments.

In order to form the marker pattern 110, the metal layer from which the marker pattern 110 is formed may be etched to include a first plurality of large, discrete pads of metal, referred to herein as large markers 114. The metal layer from which the marker pattern 110 is formed may also be etched to include a second plurality of small, discrete pads of metal, referred to herein as small markers 116. As shown for example in FIGS. 3 and 4, each large marker 114 may have an associated group of small markers 116 oriented in stepwise staggered rows. Only some of the large and small markers are numbered in the figures. A single TEG circuit 106 may have a number of groups of large and small markers associated with it (off to its side). In further examples, a single TEG circuit 106 may have a single group of large and small markers associated with it. In still further examples, multiple TEG circuits 106 may have a single group of large and small markers associated with them. While only a small portion of a scribe line area 104 is shown in FIG. 3, other scribe line areas 104 having TEG circuits 106 may also have marker patterns 110 associated with the TEG circuits.

Figure 4:
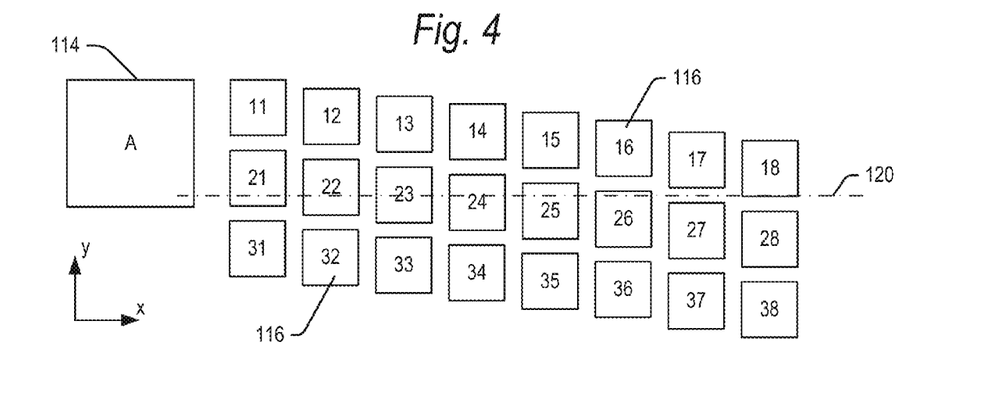
FIG. 4 is an enlarged top view of a group of markers of the marker pattern of FIG. 3.

Each of the large markers 114 and associated group of small markers 116 may be distinguished from the each other with an alphanumeric (or other) symbol. In the embodiment shown, the respective large markers are marked with successive letters A-F, and the small markers have numbers (FIG. 4). The letters, numbers or other symbolic identifiers may be formed on or into (as by etching) the large and small markers. In further embodiments, the large and/or small markers may be devoid of any alphanumeric characters or other symbols. In such embodiments, the large markers would all look the same, as would the small markers. In this example, in order to identify a particular large, small marker pair associated with a hot spot defect (as explained below), the small marker's position within the group of small markers may be counted, and the associated large marker may be counted from some reference position to keep track of which large/small marker pair is associated with the defect.

In embodiments, the large markers may for example be 5 μm-10 μm squares, and the small markers may for example be 2 μm-5 μm squares. However, it is understood that the size of the large and/or small square markers 114, 116 may be larger or smaller than those ranges in further embodiments. Moreover, the shape of the markers need not be square in further embodiments. It is conceivable that the large and/or markers 114, 116 may be rectangular or oval (with the long axis oriented along either the x-axis or y-axis), or circular.

Referring now to FIG. 4, each large marker 114 may have an associated group of small markers 116. In the embodiment shown, each large marker 114 has three staggered rows of small markers 116, with eight small markers in each row, for a total of 24 small markers. In the embodiment shown, each small marker in the first staggered row is designated with a 1 for the first row, and then number 1 to 8 for the markers in the row. Each small marker in the second row is designated with a 2 for the second row, and then 1 to 8 for the markers in the row. And each small marker in the third row is designated with a 3 for the third row, and then 1 to 8 for the markers in the row. The different markers 116 associated with a given large marker 114 may be numbered differently in further embodiments, for example consecutively 1 through 24. It is understood that the number of rows of small markers, and/or the number of markers in each row, may vary in embodiments.

Each small marker 116 in a row of markers may be vertically offset along the y-axis with respect to each other by for example 1 µm to 2 µm. The offset may be greater or lesser than this range in further embodiments. However, as the offset of the respective small markers 116 provides the enhanced resolution according to aspects of the present technology, offsets greater than 5 µm may negate the benefits of the present technology. As indicated by dashed line 120 in FIG. 4, the first small marker 116 in the second row (small marker 21) is offset along the y-axis (vertically lower than) the last small marker 116 in the first row (small marker 18) by the same vertical offset as small markers 116 in a row. Similarly, the first small marker 116 in the third row (small marker 31) is offset along the y-axis below the last small marker 116 in the second row (small marker 28) by the same vertical offset as small markers 116 in a row. Thus, all of the markers 116 associated with a given large marker 114 may be vertically offset from each other. Similarly, the last small marker in a group (marker A-38) may be offset along the y-axis above the first small marker in the next group (marker B-11) by the same offset as markers in a row. It is understood that successive marker pairs in a row need not have the same horizontal spacing or staggered vertical offset from each other in further embodiments. Similarly, small markers in different adjacent rows and/or in different adjacent groups need not have the same vertical offset as other small marker pairs.

In operation, a circuit within the TEG circuits 106 may be scanned with a laser while a constant voltage is provided to the circuit to measure current fluctuations due to defects in the circuit according to the OBIRCH method. It is understood that other thermal laser stimulation methods may be used instead of OBIRCH in further embodiments. A more detailed discussion of the operation using the OBIRCH method will now be explained with reference to FIG. 5.

Figure 5:
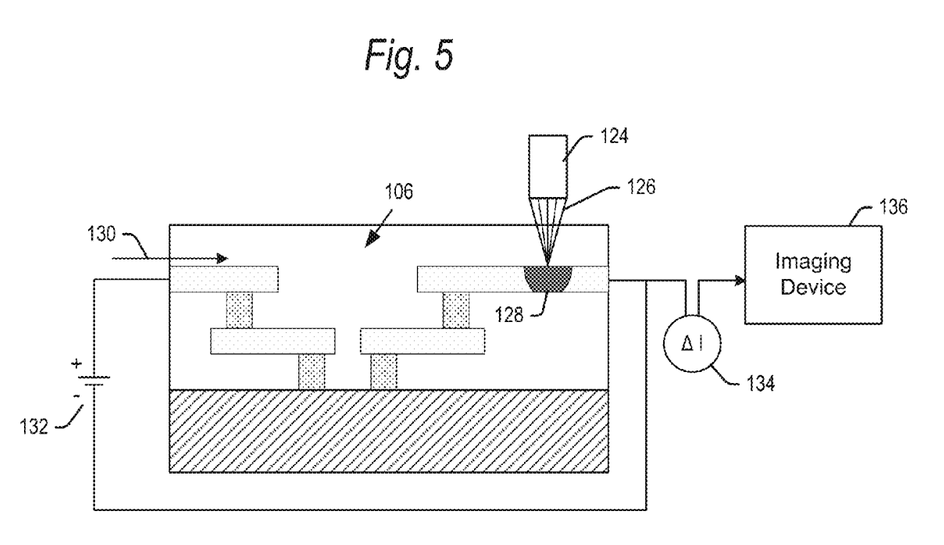
FIG. 5 is a cross-sectional side view of a circuit being tested by a thermal laser stimulation method such as OBIRCH.

A testing apparatus (now shown) actuates a laser 124 to provide a beam 126 from the top surface of sample area 128 of the TEG circuit 106. The laser may emit coherent light at a wavelength of for example 1.3 µm. In further embodiments, the laser 124 may emit light at other wavelengths and/or may be oriented to provide a beam 126 from the bottom surface of the TEG circuit 106. The testing apparatus can also supply a current 130 via a constant bias voltage source 132 to the TEG circuit 106 and sample area 128. The current flowing through the sample area 128 is detected by a high-sensitivity amplifier 134. The current data detected by the high-sensitivity amplifier 134 is transmitted to the variable current imaging device 136, which generates a heat map image of the current for example according to the Seebeck effect.

The laser moves over the conductive traces of the TEG circuit 106. When the laser beam 126 contacts each successive sample area 128, the area 128 heats slightly. The heat changes the resistance of the TEG circuit slightly. The variable current is detected by the high-sensitivity amplifier 134. By detecting the variable current and synchronizing with the position of the laser as it scans over the TEG circuit, a two-dimensional variable current image of the TEG circuit can be acquired by the variable current imaging device 136. In particular, sample areas 128 of TEG circuit 106 having a defect will heat differently than sample areas 128 not having defects. Defects may for example be a short, void, Si deposit or other type of defect. The different heat will result in different resistances at the sample areas 128 having a defect, which in turn show up as "hot spots" of a different color on the two dimensional heat map image of the TEG circuit 106 obtained by the imaging device 136. The imaging device 136 can overlay the heat map image onto an image of the TEG circuit 106 and marker pattern 110 to generate a variable current image 140 showing at least the marker pattern 110 and the hot spot defects of the TEG circuit 106.

Figure 6:
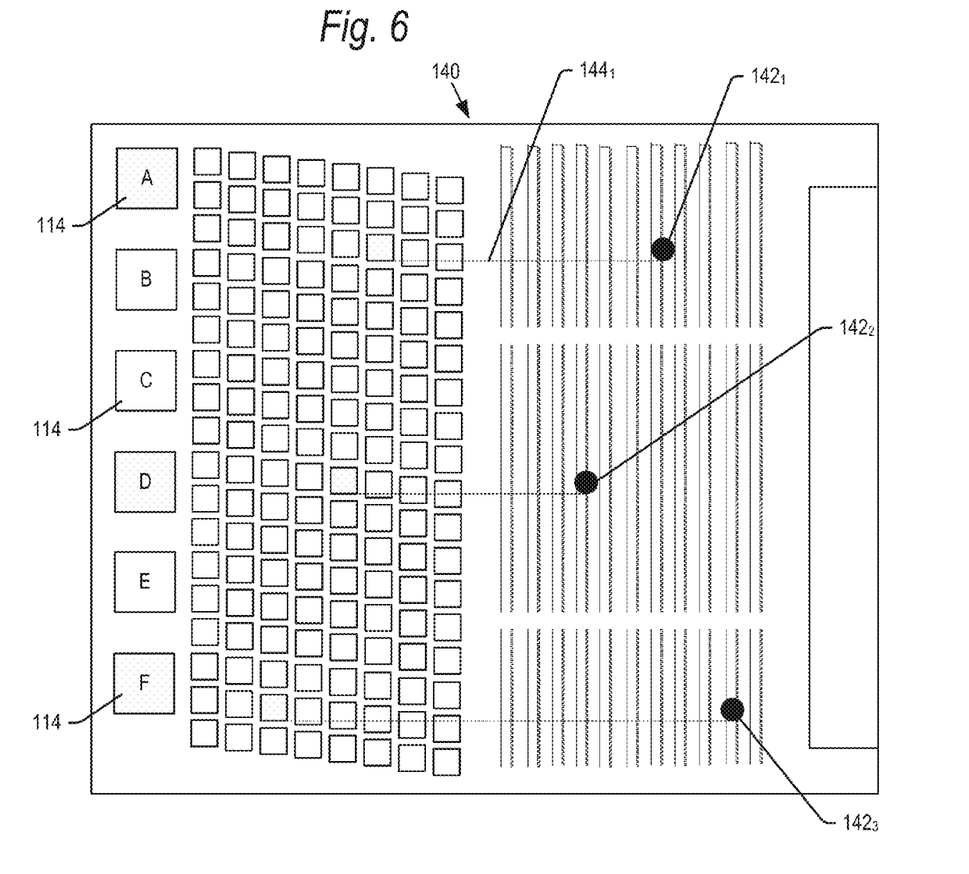
FIG. 6 is a variable current image generated by a thermal stimulation method such as OBIRCH showing defective hot spots in an integrated circuit and a marker pattern according to embodiments of the present technology.

FIG. 6 illustrates an example of a two dimensional variable current image 140 generated by the imaging device 136. The variable current image may for example be displayed on a monitor associated with the testing apparatus. The variable current image 140 in this example illustrates three detected hot spots 142 ($142_1$, $142_2$, $142_3$) corresponding to defects at those locations in the imaged TEG circuit 106. It is understood that the OBIRCH process may identify greater or lesser defects, and at other locations, in further embodiments.

Figure 7:
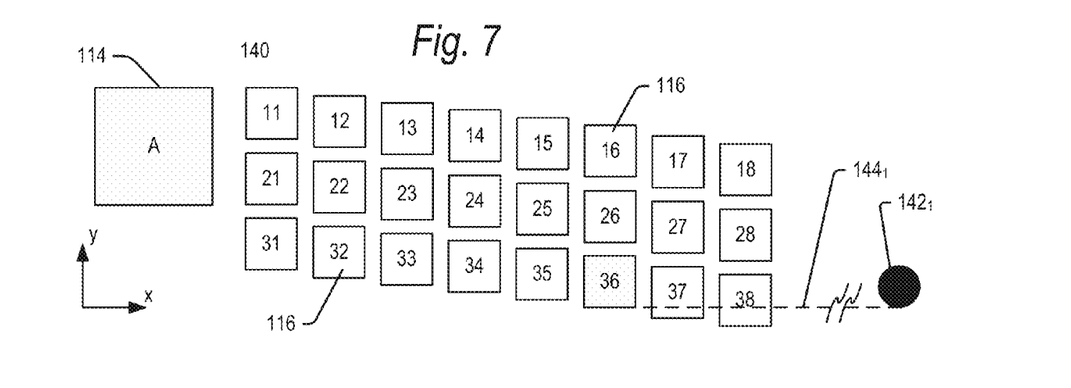
FIGS. 7-9 are enlarged views of portions of the variable current image shown in FIG. 6.

In accordance with the present technology, the location of a defect may be registered to an imaged small marker 116 and a large marker 114 appearing on the variable current image 140. For example, as indicated in the enlarged view of a portion of FIG. 6 shown in FIG. 7, a registration line $144_1$ oriented along the x-axis may indicate that the first defect $142_1$ registers with (horizontally aligns with) a small marker 36 associated with large marker A. Thus, in the illustrated example, the first defect $142_1$ registers with marker pattern identifier A-36.

Figure 8:
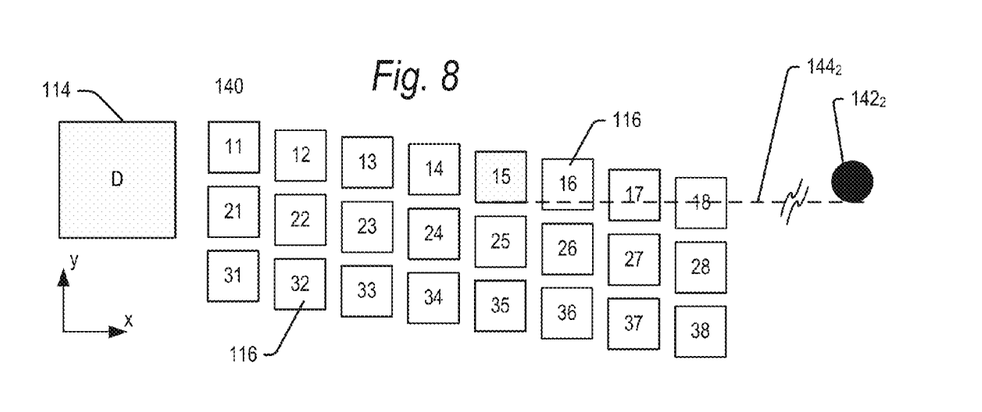

As indicated in the enlarged view of a portion of FIG. 6 shown in FIG. 8, the horizontal registration line $144_2$ may indicate that the second defect $142_2$ registers with a small marker 15 associated with large marker D. Thus, in the illustrated example, the second defect $142_2$ registers with marker pattern identifier D-15.

Figure 9:
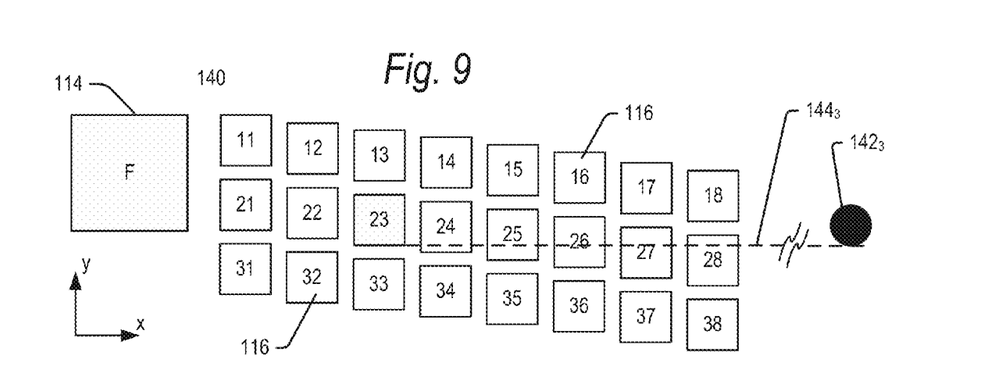

As indicated in the enlarged view of a portion of FIG. 6 shown in FIG. 9, the horizontal registration line $144_3$ may indicate that the third defect $142_3$ registers with a small marker 23 associated with large marker F. Thus, in the illustrated example, the third defect $142_3$ registers with marker pattern identifier F-23.

The x-axis registration lines 144 used to register a given defect to a given marker pattern location may not be displayed in the variable current image 140, but instead may be estimated by a viewer looking at the variable current image 140. In particular, the viewer picks a defect hot spot shown on the variable current image 140, projects an imaginary registration line 144 horizontally along the x-axis over to an aligned small marker 116, picks the large marker 114 associated with the aligned small marker 116, and that is the marker pattern identifier for that defect. The variable current image may be enlarged on the display of the testing apparatus to facilitate projection of the imaginary registration line 144 to the aligned small marker 116.

In further embodiments, that the registration line 144 may be visibly displayed on the monitor over the variable current image. In one such example, a user may move the registration line 144 and/or the variable current image to align the registration line with a given defect. The user may then sight along the registration line 144 to find the aligned small marker 116.

In a further embodiment, it is conceivable that a processor of the test apparatus detect a location of the imaged defects on the variable current image 140, and add a visible registration line 144 to the displayed image 140. Thus, each defect 142 may have a visible registration line 144 displayed on the variable current image 140, extending from the imaged defect 142 along the x-axis into the marker pattern 110 so that a viewer can see which small marker 116 aligns to the visible registration line 144 and defect 142.

In further embodiments, the processor may analyze the image 140 and automatically determine which small marker 116 is aligned with a defect along the x-axis. In this example, the processor selects the aligned small marker 116, and the registration line 144 may or may not be displayed. The processor can identify the aligned small marker 116 and associated large marker 114, and highlight those markers or otherwise display the marker pattern identifier determined to align with a defect.

In embodiments described above, the registration line is oriented along the x-axis, perpendicular to the y-axis along which greater defect resolution is sought. However, in further embodiments, especially those where the registration line is determined by the processor, the registration line need not be oriented along an axis perpendicular to the axis along which greater defect resolution is sought.

In embodiments, when the marker pattern 110 is initially defined in the metal layer, each marker pattern identifier may be correlated to a group of bit lines. That is, each small marker may be mapped to a group of bit lines when the marker pattern 110 is defined or formed in the metal layer. Thus, when marker pattern 110 is formed in the metal layer as explained above, each small marker is placed in alignment with a known and identified group of bit lines. For example, where the bit lines are spaced apart by 50 nanometers, and each small marker 114 is offset from the next by 1 µm (1000 nanometers), determination of a marker pattern identifier aligned to a defect may narrow the number of possible bit lines in the group to twenty bit lines. This narrow and defined group of bit lines is smaller than is discernable using conventional OBIRCH or other thermal laser scanning techniques alone. Thus, in operation, when a particular marker pattern identifier associated with a defect is determined, a narrow and defined group of bits lines may be identified. This defined group of bit lines may thereafter be focused on in further testing to identify the actual bit line having the defect. While defect location resolution by thermal laser scanning techniques may not a problem with respect to word lines, it is understood that the principles of the embodiments of the present technology may be applied to identify defect locations in word lines.

In the embodiments described above, the registration line 144 aligns with the bottom of a defect 142 shown on image 140 and a bottom of a small marker 116 shown on image 140. However, it is understood that the registration line 144 may be aligned with a middle, top or other section of an imaged defect 142. The registration line 144 may also be aligned with a middle, top or other section of an imaged small marker 116.

In embodiments described above, the large markers are used to enable easy identification of the specific small marker aligning with the defect(s). However, in further embodiments, it is conceivable that the large markers may be omitted. In such embodiments, the marker pattern may simply consist of the small marker pattern, where small markers which align with defects may be identified and recognized. In embodiments having no large markers, each of the small markers may be provided with a different alphanumeric character or symbol. It is also conceivable in such an embodiment that small markers may still be grouped into visibly distinct groups. For example, markers in a first group may be offset downward from each other going left to right along the row (as shown in FIGS. 6-9). Markers in a second, adjacent group may be offset downward from each other going right to left along the row (mirror image from that shown in FIGS. 6-9). Other methods of visibly distinguishing groups of small markers are contemplated.

Instead of forming pads in the metal layer as the marker pattern, it is understood that other structures may be formed in one or more of the metal layers which may be used as a marker pattern in further embodiments. One such further example is shown in FIGS. 10-16. In this embodiment, a marker pattern 220 may use vias as the markers to better and more accurately evaluate where the defects are with respect to the bit lines.

As indicated above, once semiconductors are defined, they may be interconnected to form circuits in the TEGs 106 and semiconductor die 102 by the formation of a plurality of metal traces. These plurality of metal traces may be etched from metal layers that are separated from each other by insulating layers. Electrical traces formed in two or more different layers may be selectively connected to each other by vias which are drilled between the layers and then filled with an electrical conductor such as tungsten to electrically interconnect the traces at opposite ends of the via.

Figure 10:
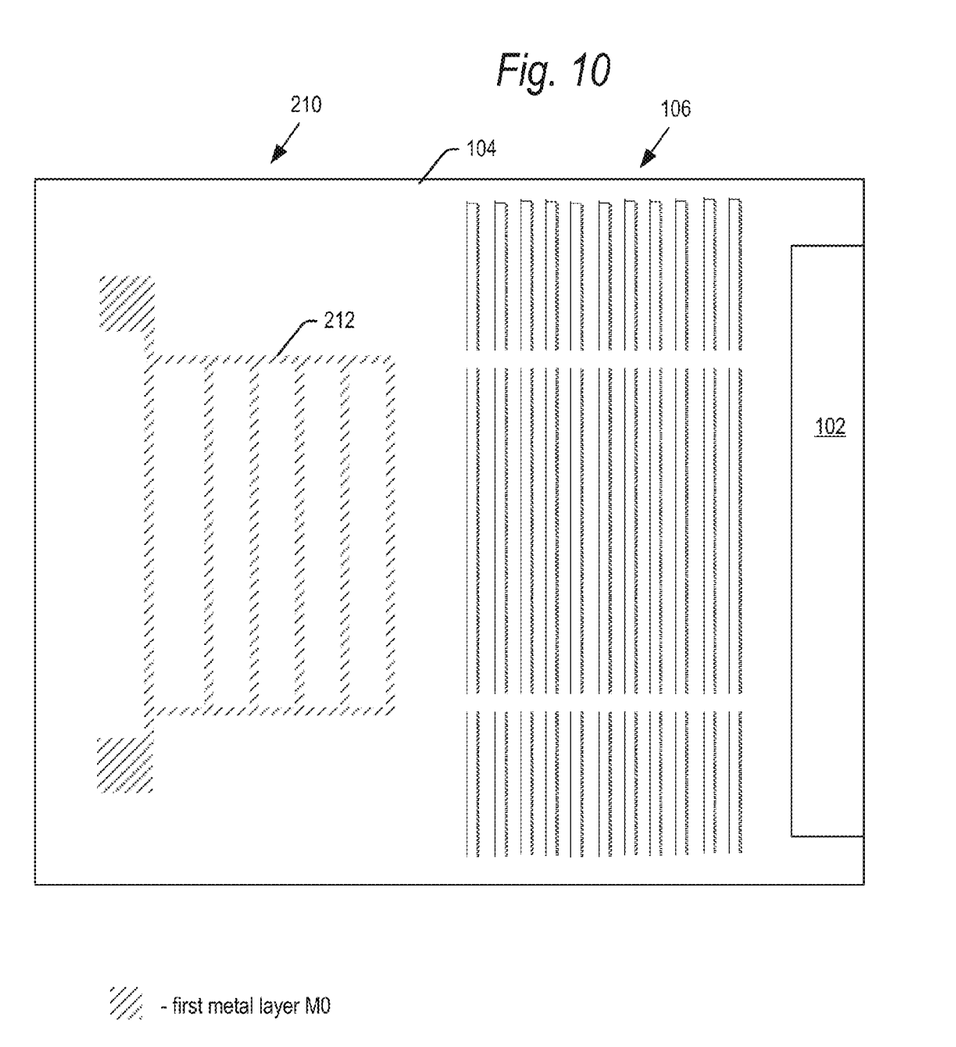
FIGS. 10-12 are views illustrating the formation of a marker pattern in a scribe line area according to an alternative embodiment of the present technology.
Figure 11:
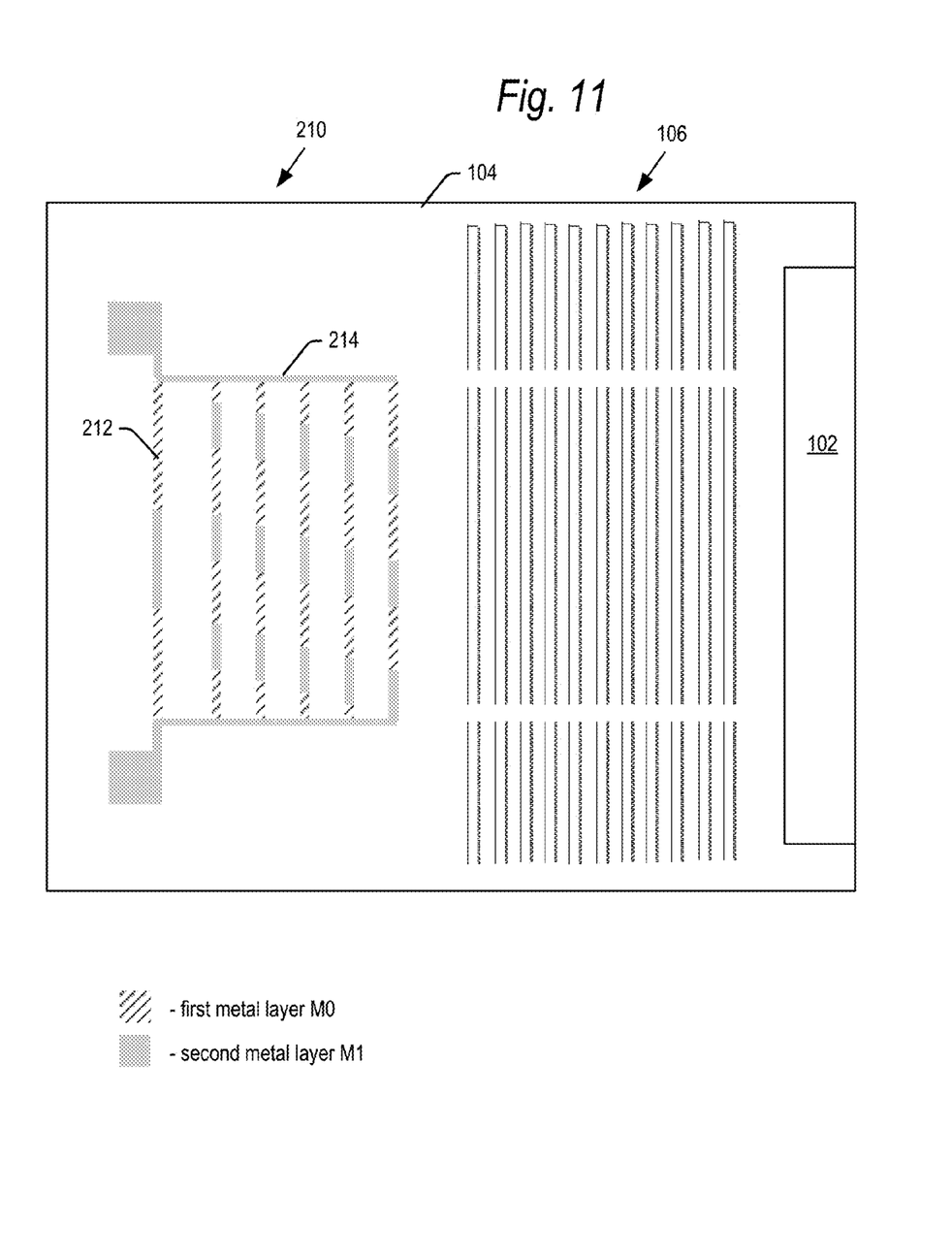
Figure 12:
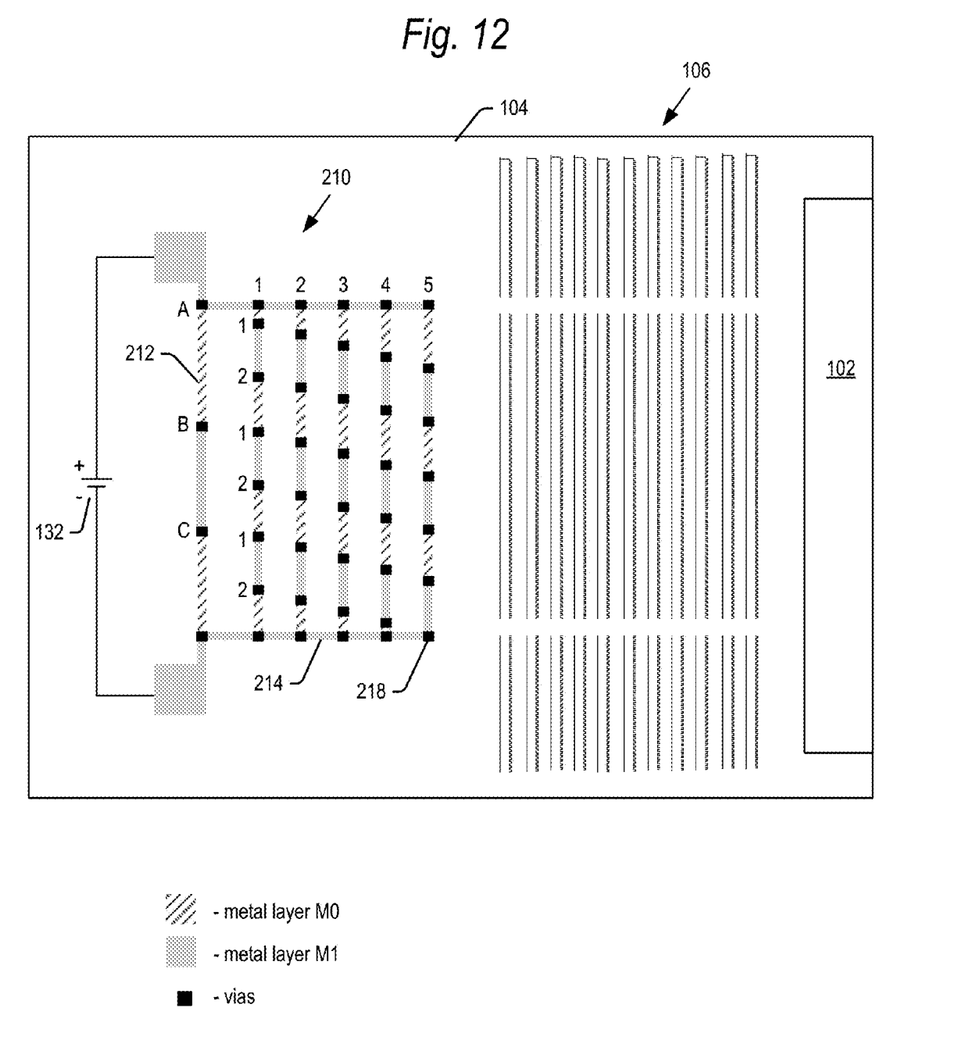

In accordance with this aspect of the technology, the marker pattern 210 may make use of vias formed in the metal layers that are deposited to the side of the one or more TEG circuits 106. FIGS. 10-12 illustrate formation of the marker pattern 210. As shown in FIG. 10, a first metal layer may be deposited and etched as part of pattern 212. An insulating layer is deposited over the first metal layer, and then a second metal layer is deposited on the first and etched into pattern 214 as shown in FIG. 11. Lastly, vias 218 (also called marker vias) are drilled between the respective layers as shown in FIG. 12. Only one via 218, and one section of the first and second metal layers, are numbered in the figures.

The marker pattern 210 may be formed in two or more metal layers, for example the first and second metal layers, though it may be formed in other metal layers in further embodiments. The metal layers between which the vias extend may be contiguous or not contiguous in different embodiments. As above, the spacing of the marker pattern 210 from the TEG circuits 106 may vary, but in one example the marker patterns 210 may be spaced between 5 µm and 10 µm from the TEG circuits. A single TEG circuit 106 may have a single associated marker pattern 210 off to its side. In further examples, multiple TEG circuits 106 may have a single associated marker pattern 210 off to their side. In still further examples, a single TEG circuit 106 may have multiple associated marker patterns 210 off to its side.

Figure 13:
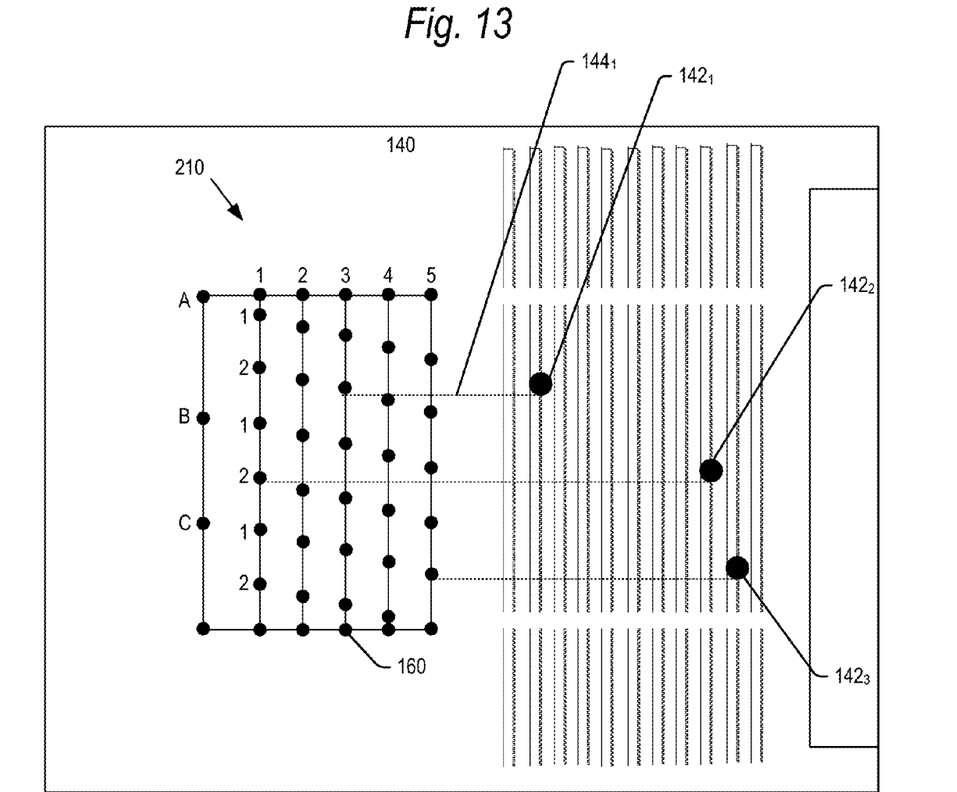
FIG. 13 is a variable current image generated by a thermal stimulation method such as OBIRCH showing defective hot spots in an integrated circuit and a marker pattern according to the alternative embodiment of FIGS. 10-12.
Figure 14:
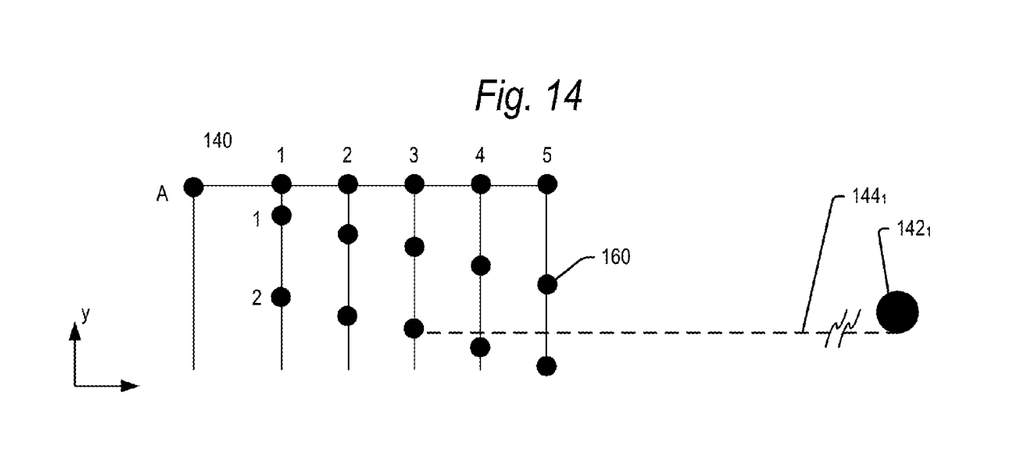
FIGS. 14-16 are enlarged views of portions of the variable current image shown in FIG. 13.

FIG. 13 illustrates a variable current image 140 obtained for the TEG circuit 106 and marker pattern 210 using a thermal laser stimulation method such as OBIRCH. In the embodiment described above, a current is supplied to the TEG circuit 106 and hot spots in the TEG circuit 106 are identified and imaged on top of a map of the marker pattern and TEG circuit to form the variable current image 140. In this embodiment, a current is supplied to both the marker pattern 210 and the TEG circuit 106, and hot spots in both the marker pattern 210 and TEG circuit are identified and imaged on top of a map of the marker pattern 210 and TEG circuit 106 to form the variable current image 140. The vias 218 show up as via hot spots 160 in the variable current image 140, in the same pattern as the vias 218 in the marker pattern 210.

In particular, in accordance with this embodiment, the testing apparatus (not shown) can supply a current via a constant bias voltage source 132 to the via marker pattern 210 (FIG. 12). The current flowing through the sample area then being heated by the laser is detected by a high-sensitivity amplifier (not shown in FIG. 12, but described above). The current data detected by the high-sensitivity amplifier 134 is transmitted to the variable current imaging device 136, which generates a heat map image of the current for example according to the Seebeck effect.

Each of the vias in the via marker pattern 210 will conduct the current differently than the connecting electrical traces. As such each of the vias will show up as via hot spots 160 on the image 140, as shown in FIG. 13 (one such hot spot 160 labeled). Thus, by running a current through the via marker pattern 210 and heating with a laser, the positions of each of the vias in the marker pattern 210 may be displayed as via hot spots 160 on the variable current image 140. These via hot spots 160 in the image 140 may be used as reference positions in the same manner as the large markers 114 and small markers 116 of the embodiment described above with respect to FIG. 3. That is, the imaged hot spot defects from the TEG circuit 106 may be aligned with an imaged via hot spot 160 in the variable current image 140 to provide greater resolution for detecting the positions of defects in the TEG circuit 106.

In the embodiment shown in FIGS. 12 and 13, the vias 218 in the marker pattern 210 may be labeled with alphanumeric characters. For example, an alphanumeric character or other symbol may be formed in the metal layer adjacent each via 218 so as to show up on the image 144. These alphanumeric characters may be used to identify specific via hot spots 160 as explained below. In further embodiments, the vias need not have associated alphanumeric characters. If not labeled with a visible alphanumeric character or other symbol, the via hot spot images 160 need to counted to keep track of which vias are associated with the TEG circuit defect as explained below.

Either before, during or after the thermal laser stimulation scan of the marker pattern 210, the TEG circuit 106 may also undergo a thermal laser stimulation scan to generate a variable current image of the defect hot spots 142 on the TEG circuit as explained above. In the example shown in FIG. 13, the scan identifies three hot spots 142 ($142_1$, $142_2$, $142_3$) corresponding to defects at those locations in the imaged TEG circuit 106. It is understood that the OBIRCH process may identify greater or lesser defects, and at other locations, in further embodiments. The image of the marker pattern 210 displayed in the variable current image 140 provides greater resolution as to the bit line locations of these defects.

The marker pattern 210 shown in FIG. 12, and the image of the marker pattern 210 shown in FIG. 13, may include a high level group of marker vias, labeled A-C in FIG. 13. A convention using other alphanumeric characters or symbols may be employed to identify high level groups instead of letters in further embodiments. It is understood that there may be greater or fewer such high level groups for a given TEG circuit 106 in further embodiments. Each high level group of marker via 218 has an associated group of low level marker vias 218, oriented in step-wise staggered rows. In the example shown, each high level group has ten low level marker vias, organized in two step-wise rows of five low level marker vias each. It is understood that the number of rows, and number of low level marker vias in each row, may vary in further embodiments.

This convention allows identification of each low level marker via in a group. For example, the first low level marker via 218 in group A may be identified as "A-11." The last low level marker via 218 in group A may be identified as "A-25." As indicated, other naming conventions may be used.

Each low level marker via 218 in a row of markers may be vertically offset along the y-axis with respect to each other by for example 1 µm to 2 µm. The offset may be greater or lesser than this range in further embodiments. However, as the offset of the respective low level marker via 218 provides the enhanced resolution according to aspects of the present technology, offsets greater than 5 µm may negate the benefits of the present technology. As in the embodiment described above, the first low level marker via 218 in the second row (low level marker 21) is vertically offset from (lower along the y-axis) the last low level marker via 218 in the first row (low level marker 15) by the same vertical offset as low level marker vias in a row. Thus, all of the marker vias 218 associated with a given high level group may be vertically offset from each other. Similarly, the last low level marker via in a group (marker A-25) may be offset along the y-axis above the first low level marker via in the next group (marker B-11) by the same offset as markers in a row. The via hot spots 160 of these low level marker vias may similarly be displayed with the same offsets.

In accordance with the present technology, the location of a defect in the TEG circuit 106 may be registered to a pair of via hot spots 160 (a high level via hot spot and a low level via hot spot) to define a high level/low level via hot spot marker pattern identifier. For example, as indicated in the enlarged view of a portion of FIG. 13 shown in FIG. 14, by lining up (along a horizontal in this example) an imaged defect in the TEG circuit 106 with the appropriate via hot spots 160, a location of the defect in the TEG circuit 106 may be associated with a marker pattern identifier. For example, in FIG. 14, a registration line $144_1$ may indicate that the first defect $142_1$ registers with (aligns along the x-axis with) a low level via hot spot 160 identified as marker 23 (third via in the second group), which is associated with high level via hot spot 160 identified as marker A. Thus, the first defect $142_1$ registers with marker pattern identifier A-23.

Figure 15:
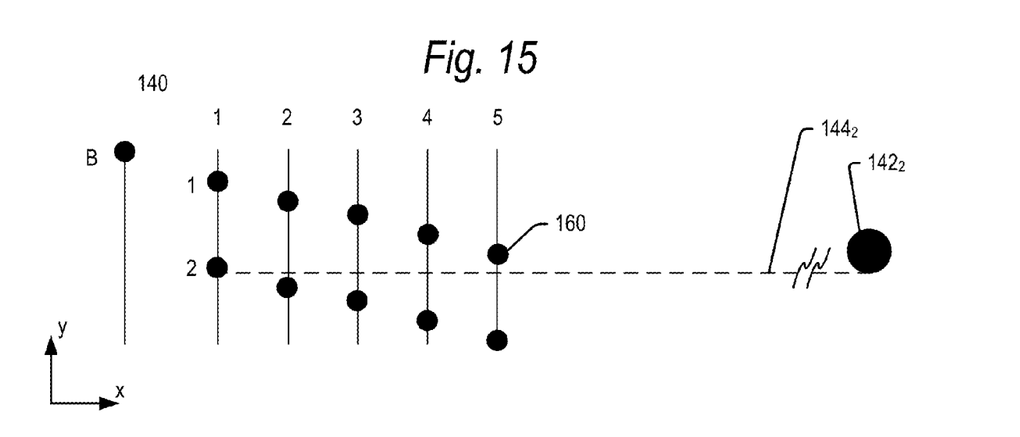

As indicated in the enlarged view of a portion of FIG. 13 shown in FIG. 15, the registration line $144_2$ may indicate that the second defect $142_2$ registers with a low level via hot spot 160 identified as marker 21 associated with high level via hot spot identified as marker B. Thus, the second defect $142_2$ registers with marker pattern identifier B-21.

Figure 16:
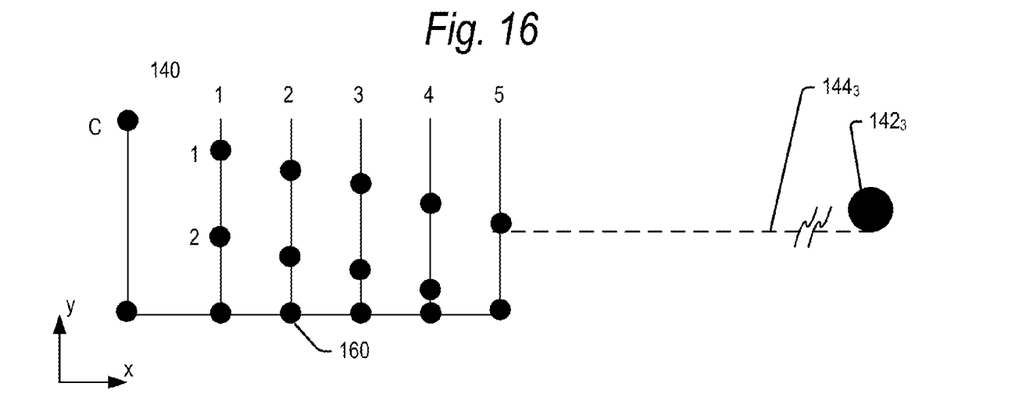

As indicated in the enlarged view of a portion of FIG. 13 shown in FIG. 16, the registration line $144_3$ may indicate that the third defect $142_3$ registers with a low level hot spot 160 identified as marker 15 associated with high level via hot spot 160 identified as marker C. Thus, the third defect $142_3$ registers with marker pattern identifier C-15.

As above, the registration lines 144 used to register a given defect to an image of a given marker pattern via may not be displayed in the variable current image 140, but instead may be estimated by a viewer looking at the variable current image 140 as described above. The variable current image may be enlarged on the display to facilitate projection of the imaginary registration line 144 along the x-axis to the image of the aligned low level marker via 218.

In further embodiments, it is conceivable that the registration lien 144 may be visible. For example, a processor of the test apparatus may detect a location of the imaged defects on the variable current image 140, and add a visible registration line 144 to the displayed image 140. Thus, each defect 142 may have a visible registration line 144 displayed on the variable current image 140, extending from the imaged defect 142 along the x-axis into the image of the marker pattern 210 so that a viewer can see which low level marker via 218 aligns to the visible registration line 144 and defect 142.

In further embodiments, the processor may analyze the image 140 and determine which low level marker via 218 is aligned with a defect along the x-axis. In this example, the processor is selecting the image of the aligned low level marker via 218, and the registration line 144 may or may not be displayed. The processor can identify the aligned low level marker via 218 and associated high level marker via 218, and highlight the image of those marker vias or otherwise display the marker pattern identifier determined to align with a defect.

As described above, each marker pattern identifier for the embodiment of FIGS. 10-16 may be correlated to a group of bit lines. That is, each low level marker may be mapped to a group of bit lines prior to or at the definition of the marker pattern 210 in the metal layers. Thus, when the high and low level marker vias are defined in the metal layers as explained above, each low level marker via is placed in alignment with a known and identified group of bit lines. For example, where the bit lines are spaced apart by 50 nanometers, and each low level marker via is offset from the next by 1 µm (1000 nanometers), determination of a marker pattern identifier aligned to a defect may narrow the number of possible bit lines in the group to twenty bit lines. Thereafter, in operation, when a particular marker pattern identifier associated with a defect is determined, a narrow and defined group of bits lines may be identified. This defined group of bit lines may thereafter be focused on in further testing to identify the actual bit line having the defect.

In the embodiments of FIGS. 10-16 described above, the registration line 144 aligns with the bottom of a defect 142 shown on image 140 and a bottom of a low level marker via 218 shown on image 140. However, it is understood that the registration line 144 may be aligned with a middle, top or other section of an imaged defect 142. The registration line 144 may also be aligned with a middle, top or other section of an imaged low level marker via 218.

In embodiments described above, marker patterns may be formed adjacent TEG circuits to provide greater resolution as to the location of the TEG circuit bit line having the defect. In further embodiments, the marker patterns may be formed adjacent an integrated circuit in semiconductor die 102 (either in the scribe line area 104 or on a portion of the semiconductor die 102) to provide greater resolution as to the location of a semiconductor die integrated circuit bit line having a defect.

In summary, an embodiment of the present technology relates to a system for enhancing resolution of a defect location along an axis in semiconductor defect analysis employing a thermal laser stimulation system, comprising: a marker pattern positioned adjacent an integrated circuit, the marker pattern comprising a plurality of markers, oriented in a row, markers in the row offset from each other along the axis, the markers in the marker pattern enhancing resolution of the defect location by enabling alignment of an image of the defect with an image of a marker in the marker pattern.

In a further embodiment, the present technology relates to a system for enhancing resolution of a defect location along an axis in semiconductor defect analysis employing a thermal laser stimulation system, comprising: a marker pattern positioned adjacent an integrated circuit, the marker pattern comprising a plurality of markers, oriented in a row, markers in the row offset from each other along the axis, the markers in the marker pattern enhancing resolution of the defect location by enabling alignment of the defect with a marker in the marker pattern.

In another embodiment, the present technology relates to a system for system for enhancing resolution of a defect location in semiconductor defect analysis employing a thermal laser stimulation system, comprising: a semiconductor wafer including a integrated circuits and a scribe line area, the integrated circuits including a first metal layer formed into electrical traces; and a marker pattern formed from a second metal layer in the scribe line area, the marker pattern including a plurality of markers for enhancing resolution of the defect location by enabling alignment of an image of the defect with an image of a marker in the marker pattern.

In a further embodiment, the present technology relates to a system for enhancing resolution of a defect location in semiconductor defect analysis employing a thermal laser stimulation system, comprising: a semiconductor wafer including a plurality of semiconductor die separated from each other by scribe line areas, a scribe line area extending along an axis; a test element group circuit in a scribe line area, the test element group circuit having bit lines extending along the axis; a marker pattern formed in a metal layer in the scribe line area next to the test element group and offset from the test element group in a direction perpendicular to the axis, the marker pattern comprising a plurality of markers, oriented in a row, markers in the row offset from each other along the axis, the markers in the marker pattern enhancing resolution of the defect location by enabling alignment of an image of the defect with an image of a marker in the marker pattern.

In another embodiment, the present technology relates to a method for enhancing resolution of a defect location along an axis in semiconductor defect analysis, comprising: (a) forming a plurality of integrated circuits on a wafer, the integrated circuits including electrical traces formed from a first metal layer; and (b) forming a marker pattern in a second metal layer, the marker pattern including a plurality of markers for enhancing resolution of the defect location by enabling alignment of the defect in the integrated circuit with a marker in the marker pattern.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A system for enhancing resolution of a defect location along an axis in semiconductor defect analysis employing a thermal laser stimulation system, comprising:
   a marker pattern positioned adjacent an integrated circuit, the marker pattern comprising a plurality of markers, oriented in a row, markers in the row offset from each other along the axis, the markers in the marker pattern enhancing resolution of the defect location by determining alignment of an image of the defect with an image of a marker in the marker pattern;
   wherein the marker pattern comprises large markers and small markers, a group of small markers grouped to a large marker, a defect aligning with a small marker and identified by the small marker and large marker to which the small marker is grouped.

2. The system of claim 1, wherein the larger markers comprise high level marker vias and the small markers comprise low level marker vias, a group of low level marker vias grouped to a high level marker via, a defect aligning with a low level marker via and identified by the low level marker via and the high level marker via to which the low level marker via is grouped.

3. The system of claim 1, wherein markers in the marker pattern are offset from each other along the axis between 1 µm and 2 µm.

4. The system of claim 1, wherein markers in the marker pattern are arranged grouped rows, a group of rows comprising three rows.

5. The system of claim 1, wherein markers in the marker pattern are arranged grouped rows, a group of rows comprising two rows.

6. The system of claim 1, wherein markers in the marker pattern are arranged in a plurality of rows, the last marker in a first row offset from first marker in a second row by a distance which is the same as the distance by which markers in the first row are offset from each other.

7. The system of claim 1, wherein the marker pattern is located in a scribe line area of the wafer.

8. The system of claim 1, wherein the marker pattern enables visual alignment of the defect with a marker in the marker pattern along a reference line perpendicular to the axis.

9. The system of claim 1, wherein the marker pattern enables visual alignment of the defect with a marker in the marker pattern.

10. The system of claim 1, wherein the system further comprises a processor for aligning a marker in the marker pattern with the defect.

11. A system for enhancing resolution of a defect location in semiconductor defect analysis employing a thermal laser stimulation system, comprising:
    a semiconductor wafer including a integrated circuits and a scribe line area, the integrated circuits including a first metal layer formed into electrical traces; and
    a marker pattern formed from a second metal layer in the scribe line area, the marker pattern including a plurality of markers for enhancing resolution of the defect location by identifying which marker of the plurality of markers is aligned with the defect;
    wherein the marker pattern comprises high level marker vias and low level marker vias, a group of low level marker vias grouped to a high level marker via, a defect aligning with a low level marker via and identified by the low level marker via and the high level marker via to which the low level marker via is grouped.

12. The system of claim 11, wherein the first and second metal layers are the same metal layer.

13. The system of claim 11, wherein the first and second metal layers are different metal layers.

14. The system of claim 11, wherein the alignment enabled by the marker pattern is a visual alignment.

15. The system of claim 11, wherein the alignment enabled by the marker pattern is an alignment performed by a processor.

16. A system for enhancing resolution of a defect location in semiconductor defect analysis employing a thermal laser stimulation system, comprising:
    a semiconductor wafer including a plurality of semiconductor die separated from each other by scribe line areas, a scribe line area extending along an axis;
    a test element group circuit in a scribe line area, the test element group circuit having bit lines extending along the axis;
    a marker pattern formed in a metal layer in the scribe line area next to the test element group and offset from the test element group in a direction perpendicular to the axis, the marker pattern comprising a plurality of markers, oriented in a row, markers in the row offset from each other along the axis, the markers in the marker pattern enhancing resolution of the defect location by enabling alignment of an image of the defect with an image of a marker in the marker pattern;
    wherein the marker pattern comprises high level marker vias and low level marker vias, a group of low level marker vias grouped to a high level marker via, a defect aligning with a low level marker via and identified by the low level marker via and the high level marker via to which the low level marker via is grouped.

17. The system of claim 16, wherein the high level marker vias of the marker pattern comprise large markers and the low level marker vias of the marker pattern comprise small markers, a group of small markers grouped to a large marker, a defect aligning with a small marker and identified by the small marker and large marker to which the small marker is grouped.

18. The system of claim 16, wherein markers in the marker pattern are offset from each other along the axis between 1 µm and 2 µm.

19. The system of claim 16, wherein markers in the marker pattern are arranged in a plurality of rows, the last marker in a first row offset from first marker in a second row by a distance which is the same as the distance by which markers in the first row are offset from each other.

20. A method for enhancing resolution of a defect location along an axis in semiconductor defect analysis, comprising:
    (a) forming a plurality of integrated circuits on a wafer, the integrated circuits including electrical traces formed from a first metal layer; and
    (b) forming a marker pattern in a second metal layer by forming a plurality of groups of marker patterns, a group of the groups including a large marker and a plurality of small markers, the markers of the plurality of small markers offset from each other along the axis, the marker pattern enhancing resolution of the defect location by determining alignment of the defect in the integrated circuit with a small marker of the plurality of small markers.

21. The method of claim 20, said step (b) of forming a plurality of groups of marker patterns comprising the step of forming a plurality of vias as the larger and small markers.

22. The method of claim 20, said step (b) of forming a marker pattern in the second metal layer comprises the step of forming the marker pattern in the same metal layer as used to form the metal traces in the integrated circuit.

23. The method of claim 20, said step (b) of forming a marker pattern in the second metal layer comprises the step of forming the marker pattern in a scribe line area of a wafer.

* * * * *